United States Patent
Lin (10) Patent No.: US 7,109,760 B1
(45) Date of Patent: Sep. 19, 2006

(54) DELAY-LOCKED LOOP (DLL) INTEGRATED CIRCUITS THAT SUPPORT EFFICIENT PHASE LOCKING OF CLOCK SIGNALS HAVING NON-UNITY DUTY CYCLES

(75) Inventor: James K. Lin, Cupertino, CA (US)

(73) Assignee: Integrated Device Technology, Inc., (KR)

( * ) Notice: Subject to any disclaimer, the term of this patent is extended or adjusted under 35 U.S.C. 154(b) by 0 days.

(21) Appl. No.: 10/880,804

(22) Filed: Jun. 30, 2004

Related U.S. Application Data (60) Provisional application No. 60/534,318, filed on Jan. 5, 2004.

(51) Int. Cl.
G01R 25/00 (2006.01)
H03D 13/00 (2006.01)

(52) U.S. Cl. .................. 327/12; 327/3; 327/7
(58) Field of Classification Search ................ 327/156, 327/1–12, 15, 147
See application file for complete search history.

(56) References Cited

U.S. PATENT DOCUMENTS

| | | | |
|---|---|---|---|
| 5,121,010 A * | 6/1992 | Hoshizaki et al. ............ 327/3 |
| 5,317,219 A | 5/1994 | Lupi et al. .................. 307/603 |
| 5,374,860 A | 12/1994 | Llewellyn ................... 327/276 |
| 5,485,490 A | 1/1996 | Leung et al. ................ 375/371 |
| 5,534,807 A * | 7/1996 | Inada et al. ................. 327/234 |
| 5,561,692 A | 10/1996 | Maitland et al. ............ 375/371 |
| 5,614,855 A | 3/1997 | Lee et al. .................... 327/158 |
| 5,719,515 A | 2/1998 | Danger ........................ 327/270 |
| 5,818,769 A | 10/1998 | Tweed et al. ................ 365/194 |
| 5,828,257 A | 10/1998 | Masleid ...................... 327/276 |
| 5,844,954 A | 12/1998 | Casasanta et al. ........... 375/373 |
| 5,847,616 A | 12/1998 | Ng et al. ....................... 331/57 |
| 5,910,740 A | 6/1999 | Underwood ................. 327/149 |
| 5,923,597 A | 7/1999 | Tweed et al. ................ 365/194 |
| 6,125,157 A | 9/2000 | Donnelly et al. ........... 375/371 |
| 6,134,180 A | 10/2000 | Kim et al. ................... 365/233 |
| 6,194,937 B1 | 2/2001 | Minami ...................... 327/270 |

(Continued)

OTHER PUBLICATIONS

Dehng et al., Clock-Deskew Buffer Using a SAR-Controlled Delay-Locked Loop, IEEE Journal of Solid-State Circuits, vol. 35, No. 8, Aug. 2000, pp. 1128-1136.

(Continued)

*Primary Examiner*—Dinh T. Le
(74) *Attorney, Agent, or Firm*—Myers Bigel Sibley & Sajovec PA (57) ABSTRACT

Delay-locked loop (DLL) integrated circuits include digital phase comparators that are unaffected by variable duty cycle ratios. These phase comparators determine a shortest direction to phase lock before establishing a value of a compare signal (COMP) that specifies the shortest direction. The phase comparator is responsive to a reference clock signal REF and a feedback clock signal FB. These clock signals have equivalent periods and may have equivalent non-unity duty cycle ratios. The phase comparator is configured to determine whether a first degree to which the reference clock signal REF leads the feedback clock signal FB is smaller or larger than a second degree to which the reference clock signal REF lags the feedback clock signal FB. Based on this determination, the phase comparator generates a compare signal COMP that identifies a direction in time the feedback clock signal FB should be shifted to bring it into alignment with the reference clock signal REF. This direction represents a speed-up direction when the first degree is determined to be less than the second degree or a slow-down direction when the second degree is determined to be less than the first degree.

36 Claims, 7 Drawing Sheets

U.S. PATENT DOCUMENTS

| | | | |
|---|---|---|---|
| 6,239,892 B1 | 5/2001 | Davidson | 359/135 |
| 6,255,969 B1 | 7/2001 | Crayford | 341/100 |
| 6,265,902 B1 * | 7/2001 | Klemmer et al. | 327/2 |
| 6,275,899 B1 | 8/2001 | Savell et al. | 711/118 |
| 6,285,172 B1 | 9/2001 | Torbey | 323/237 |
| 6,285,229 B1 | 9/2001 | Chu et al. | 327/277 |
| 6,288,574 B1 | 9/2001 | Neary | 327/12 |
| 6,313,621 B1 | 11/2001 | Zwack | 324/76.52 |
| 6,313,676 B1 | 11/2001 | Abe et al. | 327/158 |
| 6,313,709 B1 * | 11/2001 | Nishimura et al. | 331/25 |
| 6,348,827 B1 | 2/2002 | Fifield et al. | 327/278 |
| 6,356,099 B1 | 3/2002 | Lee et al. | 326/24 |
| 6,356,158 B1 | 3/2002 | Lesea | 331/11 |
| 6,359,489 B1 | 3/2002 | Huang | 327/291 |
| 6,366,150 B1 | 4/2002 | Ishimi | 327/276 |
| 6,400,202 B1 | 6/2002 | Fifield et al. | 327/291 |
| 6,411,142 B1 | 6/2002 | Abbasi et al. | 327/156 |
| 6,424,228 B1 | 7/2002 | Ahn et al. | 331/1 A |
| 6,477,110 B1 | 11/2002 | Yoo et al. | 365/233 |
| 6,539,072 B1 | 3/2003 | Donnelly et al. | 375/371 |
| 6,556,489 B1 * | 4/2003 | Gomm et al. | 365/194 |
| 6,622,255 B1 * | 9/2003 | Kurd et al. | 713/503 |
| 6,664,838 B1 | 12/2003 | Talledo | 327/277 |
| 6,894,539 B1 * | 5/2005 | Kim | 327/3 |

OTHER PUBLICATIONS

Minami et al., A 1-GHz Portable Digital Delay-Locked Loop with Infinite Phase Capture Ranges, IEICE Trans. Electron., vol. E84-C, No. 2, Feb. 2001, pp. 220-228.

Okajima et al., "Digital Delay Locked Loop and Design Technique for High-Speed Synchronous Interface," IEICE Trans. Electron., vol. E79-C, No. 6, Jun. 1996, pp. 798-806.

Ryan, Kevin, "DDR SDRAM Functionality and Controller Read Data Capture," Micron Technology, Inc., vol. 8, Issue 3, 1999, pp. 1-24.

Lee et al., "A 2.5 V CMOS Delay-Locked Loop for an 18 Mbit, 500 Megabyte/s DRAM," IEEE Journal of Solid-State Circuits, vol. 29, No. 12, Dec. 1994, pp. 1491-1496.

* cited by examiner

FIG. 3C ly skilled in the art, if the phases of FB and REF are different by an integer multiple of one-half the period (T) of the reference clock signal REF, then it will not matter whether the COMP signal indicates

DELAY-LOCKED LOOP (DLL) INTEGRATED CIRCUITS THAT SUPPORT EFFICIENT PHASE LOCKING OF CLOCK SIGNALS HAVING NON-UNITY DUTY CYCLES

REFERENCE TO PRIORITY APPLICATION

This application claims priority to U.S. Provisional Application Ser. No. 60/534,318, filed Jan. 5, 2004, the disclosure of which is hereby incorporated herein by reference.

FIELD OF THE INVENTION

The present invention relates to integrated circuit devices and, more particularly, to integrated circuit devices having clock generators therein and methods of generating clock signals.

BACKGROUND OF THE INVENTION

Phase-locked loop (PLL) and delay-locked loop (DLL) integrated circuits are frequently used to generate highly accurate internal clock signals on integrated circuit substrates (e.g., chips). These PLL and DLL integrated circuits may utilize phase comparators that compare a phase of a primary clock signal, such as a reference clock signal REF, to a secondary clock signal, such as a feedback clock signal FB. Phase comparators may generate output signals, such as a LOCK signal, which indicates whether the primary and secondary clock signals are in phase relative to each other (within some acceptable tolerance), and a COMP signal, which indicates whether the phase of the primary clock signal leads or lags the phase of the secondary clock signal when the two signals are not in phase relative to each other. If the COMP signal indicates a leading condition between the primary and secondary clock signals, then the PLL (or DLL) may operate to speed up the phase of the secondary clock signal. Alternatively, if the COMP signal indicates a lagging condition between the primary and secondary clock signals, then the PLL (or DLL) may operate to slow down the phase of the secondary clock signal. Conventional phase comparators may generate the LOCK signal by evaluating the presence or absence of a leading edge of the secondary clock signal within a time window centered about a leading edge of the primary clock signal. This time window is frequently referred to as a transition detection window. For high frequency applications, a relatively small transition detection window is required.

In particular, phase comparison operations may use an edge transition of one clock signal to capture a value (0 or 1) of another clock signal. For example, if a rising edge of a feedback clock signal FB captures a reference clock signal REF having a logic 1 value, then the COMP signal will cause FB to be advanced in time. Alternatively, if a rising edge of the feedback clock signal FB captures a reference clock signal REF having a logic 0 value, then the COMP signal will cause FB to be delayed in time. As will be understood by those of ordinary skill in the art, if the phases of FB and REF are different by an integer multiple of one-half the period (T) of the reference clock signal REF, then it will not matter whether the COMP signal indicates that the feedback clock signal FB should be slowed down or sped up to obtain a phase lock condition.

Operations to generate a LOCK signal within a phase comparator typically will work so long as the transition detection window is shorter than the period of the primary clock signal, and it typically does not matter whether the duty cycle of the primary clock signal is unity or not. However, operations to generate a COMP signal typically assume that the duty cycle of the primary clock signal is unity. When this is the case, the probabilities of capturing a logic 1 value or a logic 0 value are equivalent when comparing the relative phases of the primary and secondary clock signals. But, when the duty cycle of the primary clock signal is not unity, operations to generate a COMP signal and achieve phase lock between the primary and secondary clock signals may be inefficient. For example, if the duty cycle of the primary clock signal is 0.25 and a conventional linear search routine is used to achieve phase lock, then a worst case time shift of 80% of the period of the primary clock signal will need to be made to the secondary clock signal before phase lock is achieved. This is because a duty cycle of 0.25 corresponds to a primary clock signal that is high 20% of the time and low 80% of the time. Accordingly, if the secondary clock signal captures a logic 0 value of the primary clock signal immediately after a high-to-low transition of the primary clock signal, then the COMP signal will specify that the secondary clock signal needs to be slowed down to achieve phase lock. However, as the secondary clock signal is gradually slowed down, the secondary clock signal will repeatedly capture logic 0 values until time units providing a total of 80% of the period of the primary clock signal have been added to the phase of the secondary clock signal. A potentially better alternative in this case involves speeding up the secondary clock signal by only 20% of the period of the primary clock signal, but the conventional phase comparator has no way of knowing which shift direction (slower or faster) will achieve the faster lock condition. Furthermore, the relatively high degree of inefficiency in the phase locking operations may actually increase if a conventional binary search routine is used in place of the linear search routine.

SUMMARY OF THE INVENTION

Embodiments of the present invention include delay-locked loop (DLL) and phase-locked loop (PLL) integrated circuits that support efficient phase locking of clock signals having non-unity duty cycles. These locked loop integrated circuits include digital phase comparators that are unaffected by variable duty cycle ratios because they determine a shortest direction to phase lock before establishing a value of a compare signal (COMP) that specifies the shortest direction. In particular, a phase comparator is provided that is responsive to a reference clock signal REF and a feedback clock signal FB. These clock signals have equivalent periods and may have equivalent non-unity duty cycle ratios. This phase comparator is configured to determine whether a first degree to which the reference clock signal REF leads the feedback clock signal FB is smaller or larger than a second degree to which the reference clock signal REF lags the feedback clock signal FB. Based on this determination, the phase comparator generates a compare signal COMP that identifies a direction in time the feedback clock signal FB should be shifted to bring it into alignment with the reference clock signal REF. This direction represents a speed-up direction when the first degree is determined to be less than the second degree or a slow-down direction when the second degree is determined to be less than the first degree.

The phase comparator is further configured to generate a shift value signal (SHIFTVAL) that specifies an amount the feedback clock signal FB needs to be shifted to bring it into alignment with the reference clock signal REF. In many cases, the generation of this shift value signal supports a reduction in the number of feedback delay adjustments that are made by the locked loop integrated circuit to just two adjustments. This aspect of the phase comparator may surpass conventional phase comparators that support binary search routines, yet nonetheless typically require more than two phase adjustments to obtain a lock condition.

Additional embodiments of the present invention include phase comparators that generate a period value signal (PER-HOLD) that specifies the period of the reference clock signal REF. This period value signal can be used by a locked loop integrated circuit to generate phase delayed outputs. These phase comparators may also be configured to generate a lock signal LOCK that identifies whether or not the reference and feedback clock signals are aligned with each other. The operations to generate the LOCK signal include logically ORing a first lock signal, which specifies whether a leading edge of the reference clock signal REF is within a first time window relative to a leading edge of the feedback clock signal FB, with a second lock signal, which specifies whether the leading edge of the feedback clock signal FB is within a second time window relative to the leading edge of the reference clock signal REF. The first and second time windows may be equivalent.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The illustrated embodiments and multi-bit signals may also be scaled to handle clock signals have lower or higher frequencies. The suffix B or prefix N to a signal name may also denote a complementary data or information signal or an active low control signal, for example.

Figures 1A, 1B:
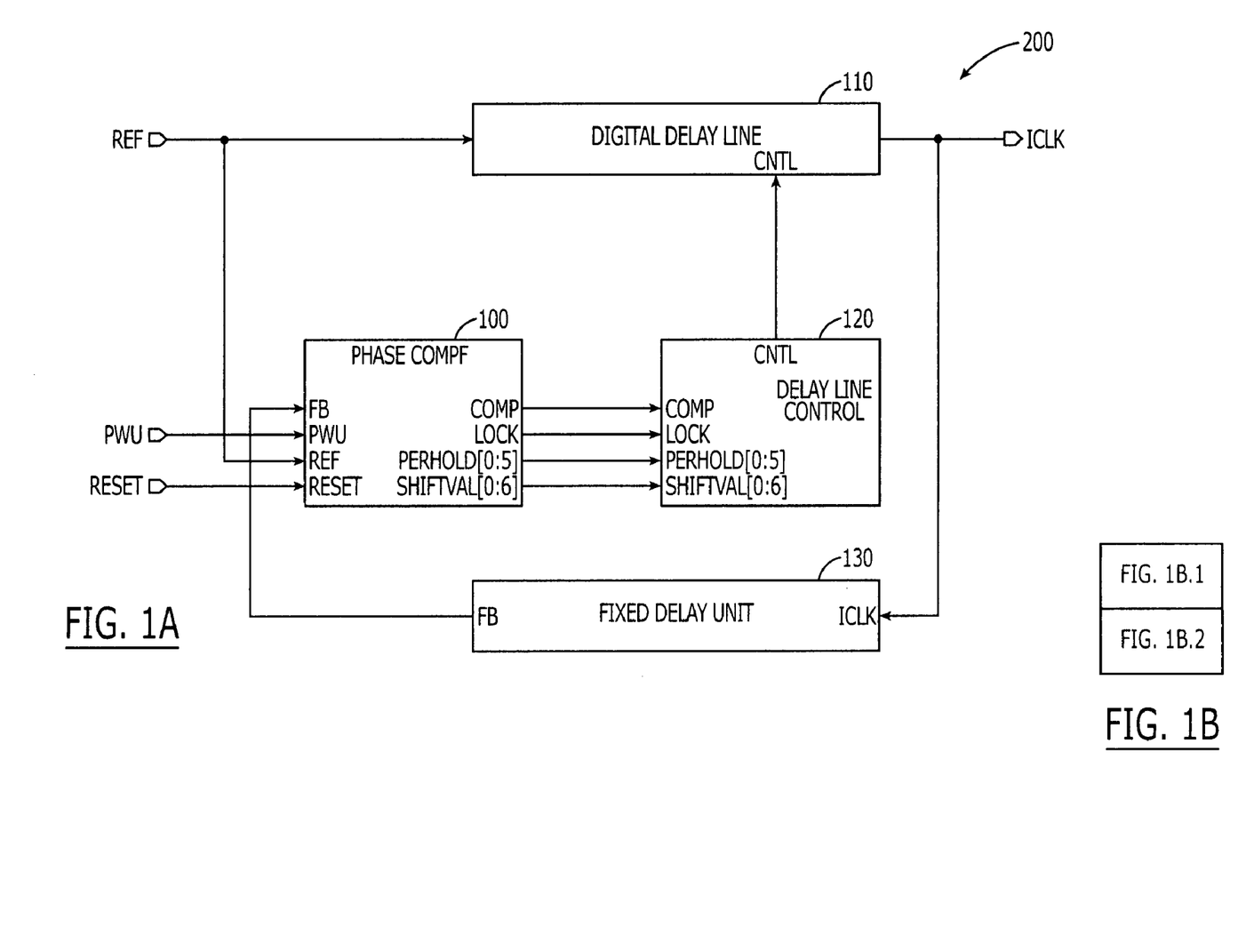
FIG. 1A is a block diagram of a delay-locked loop integrated circuit according to embodiments of the present invention.
FIG. 1B is an electrical schematic of the phase comparator of FIG. 1A, according to embodiments of the present invention.

Referring now to FIGS. 1A–1B, a delay-locked loop (DLL) integrated circuit 200 according to embodiments of the present invention will be described. The DLL integrated circuit 200 is illustrated as including a digital delay line 110 that is configured to generate an internal clock signal ICLK in response to a reference clock signal REF, which may have a non-unity duty cycle. The digital delay line 110 may comprise a plurality of delay units that collectively establish the total delay provided by the delay line 110. In some embodiments, the delay units (not shown) may provide a variable delay that is controlled by a value of a control signal (CNTL), which is generated by a delay line control circuit 120. In other embodiments, each of the delay units may provide a fixed delay, with the number of active delay units within the delay line 110 being controlled by the value of the control signal CNTL generated by the delay line control circuit 120. This control signal CNTL may be a multi-bit digital signal. Exemplary delay lines are illustrated and described in commonly assigned U.S. patent application Ser. No. 10/643,208, filed Aug. 18, 2003, and Ser. No. 10/663,624, filed Sep. 16, 2003, the disclosures of which are hereby incorporated herein by reference.

The DLL integrated circuit 200 is also illustrated as including a phase comparator 100, which is responsive to the reference clock signal REF and a feedback clock signal FB. The feedback clock signal FB typically represents a delayed version of the internal clock signal ICLK, with the degree of delay being provided by a fixed delay unit 130 that is configured to receive the internal clock signal ICLK. Based on this configuration of the DLL integrated circuit 200, the reference clock signal REF and the feedback clock signal FB will be in-phase with each other when a total delay provided by the digital delay line 110 and the fixed delay unit 130 equals an integer multiple of the period of the reference clock signal REF. The phase comparator 100 is also illustrated as being responsive to a power-up signal PWU and a reset signal RESET. When the power-up signal PWU is set to an active level (e.g., PWU=0), the DLL integrated circuit 200 is disposed in a power-up mode. During this mode, the DLL integrated circuit 200 forces all internal nodes within the digital delay line 110 to stable values to generate a stable feedback clock signal FB. As illustrated by FIG. 1B, the phase comparator 100 responds to an active power-up signal PWU by maintaining a first clock divider 20a in a reset mode while the feedback clock signal FB that drives the first clock divider 20a may be unstable. The reset signal RESET is an active high pulse that is used to reset a second clock divider 20b, which is responsive to the reference clock signal REF.

The phase comparator 100 is also illustrated as generating four output signals. These four output signals include the compare signal COMP, the lock signal LOCK, the period value signal PERHOLD[0:5] and the shift value signal SHIFTVAL[0:6]. The compare signal COMP operates to slow down FB relative to REF or speed up FB relative to REF. As described herein, when the compare signal COMP is set to a logic 1 value, the DLL integrated circuit 200 will operate to slow FB down, and when the compare signal COMP is set to a logic 0 value, the DLL integrated circuit 200 will operate to speed FB up. The lock signal LOCK specifies whether or not the reference and feedback clock signals REF and FB are in-phase. The period value signal PERHOLD[0:5], where PERHOLD[5] is the most significant bit, is the encoded size of one period (T) of the reference clock signal REF. The shift value signal SHIFTVAL[0:6] is the encoded value of the amount of delay that the DLL integrated circuit 200 must shift the feedback clock signal FB (in the direction indicated by the compare signal COMP) to lock FB in phase with REF.

The delay line control circuit 120 is responsive to the signals generated by the phase comparator 100. The delay line control circuit 120 is configured to adjust a value of the control signal CNTL upwards or downwards in response to the value of the compare signal COMP generated by the phase comparator 100. The magnitude of the initial adjustment that is made to the value of the control signal CNTL (after power-up) is typically controlled by the value of the shift value signal SHIFTVAL[0:6], with adjustments continuing thereafter, if necessary, until the lock signal LOCK indicates phase lock between REF and FB. The delay line control circuit 120 may be configured to adjust the value of the control signal CNTL so that the phase of the internal clock signal ICLK (and FB) jumps by a phase amount specified by the value of the shift value signal SHIFTVAL [0:6]. The delay line control circuit 120 may also operate to respond to the value of the period value signal PERHOLD [0:5] by generating additional control signals (not shown) that enable the DLL integrated circuit 200 to generate DLL phase delayed output signals for additional applications.

FIG. 1B illustrates an embodiment of the phase comparator 100 illustrated by FIG. 1A. The logic required to generate the period value signal PERHOLD[0:5] includes a pair of negative edge triggered D-type flip-flops (NET DFF) 10a and 10b, a positive edge triggered D-type flip-flop (PET DFF) 12a, a NOR gate 14 and a 6-bit counter 40a, which is also illustrated and described in U.S. Provisional Application Ser. No. 60/534,381, filed Jan. 5, 2004. Each of the D-type flip-flops includes a data input (D), a true output (Q) and a complementary output (NQ). The three D-type flip-flops 10a, 10b and 12a collectively generate a three-bit period position signal PERPOS[0:2] and a three-bit not period position signal NPERPOS[0:2]. The NOR gate 14 generates a period time signal PERTIME in response to the signals PERPOS1 and NPERPOS0. The 6-bit counter 40a includes a clock input (CLKDBY3), an enable input (ENABLE), a not enable input (NENABLE), a 3-bit not position signal NPOS[0:2] and a 3-bit position signal POS[0:2]. The 6-bit counter 40a generates a 6-bit hold count signal HOLDCNT[0:5] and a 6-bit not hold count signal NHOLDCNT [0:5].

Figure 2:
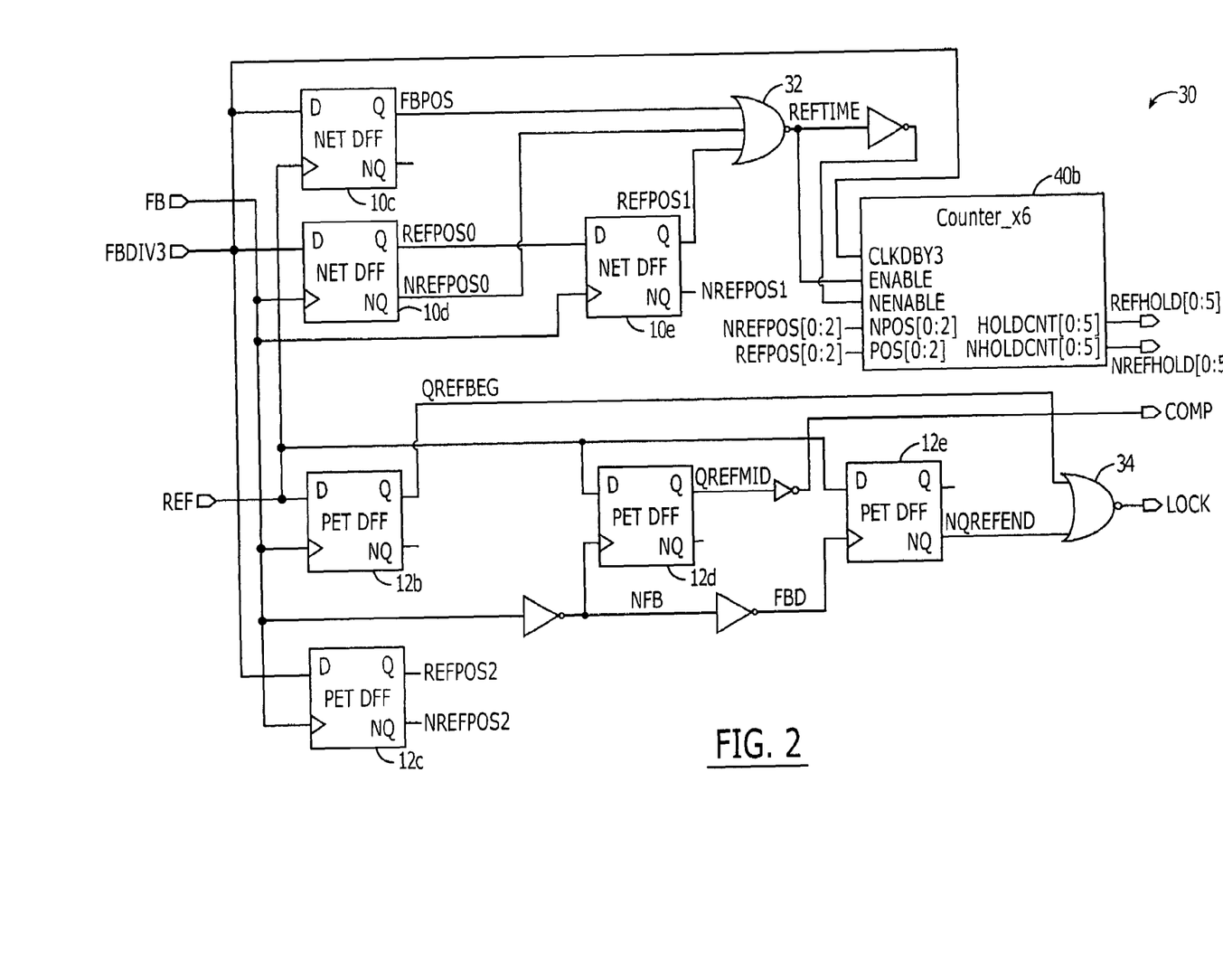
FIG. 2 is an electrical schematic of a phase half-comparator (phasecomphalf) illustrated by FIG. 1B.

The logic required to generate the compare signal COMP includes a pair of clock dividers 20a and 20b (i.e., divide-by-3 clock generators), which are synchronized with the feedback and reference clock signals FB and REF, respectively, and a pair of phase half-comparators 30a and 30b, which are illustrated in greater detail by FIG. 2. The first clock divider 20a generates the signal FBDIV3 at its output (CLKDIV3). The signal FBDIV3 is a periodic signal that is synchronized with the feedback clock signal FB and has a period that is three times a period of the feedback clock signal FB. The second clock divider 20b generates the signal REFDIV3 at its output (CLKDIV3). The signal REFDIV3 is a periodic signal that is synchronized with the reference clock signal REF and has a period that is three times a period of the reference clock signal REF. The combination of REF and REFDIV3 is used to create a periodic state sequence that will count the amount time in one period of REF. Each of the phase half-comparators 30a and 30b has three input terminals FB, FBDIV3 and REF and four output terminals COMP, LOCK, NREFHOLD[0:5] and REFHOLD[0:5]. As illustrated, the first phase half-comparator 30a generates the signals COMPREFTOFB, LOCKREFTOFB, and NREFHOLD[0:5] and the second phase half-comparator 30b generates the signals LOCKFBTOREF and FBHOLD[0:5].

Figure 1B:
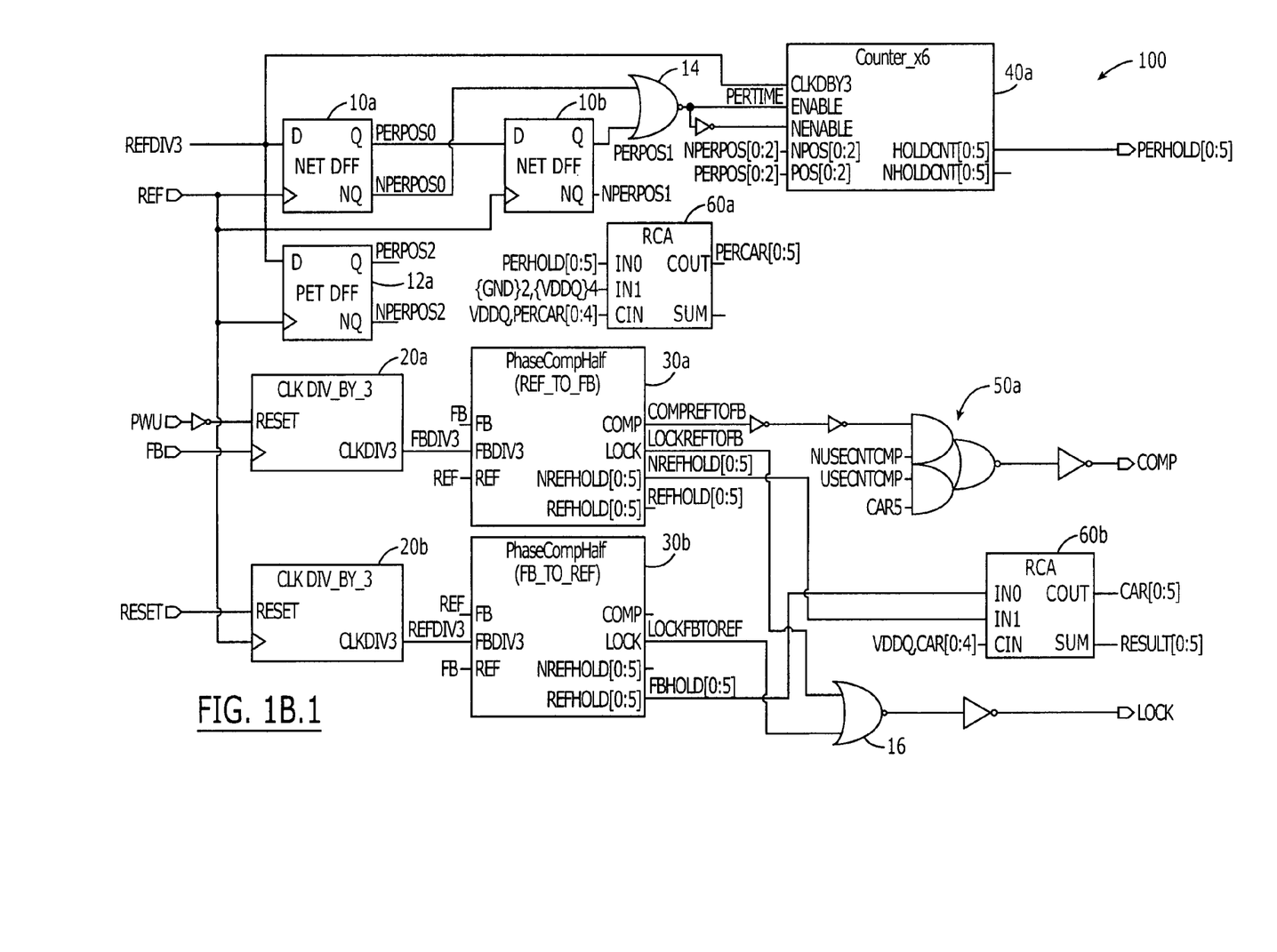
Figure 1B:
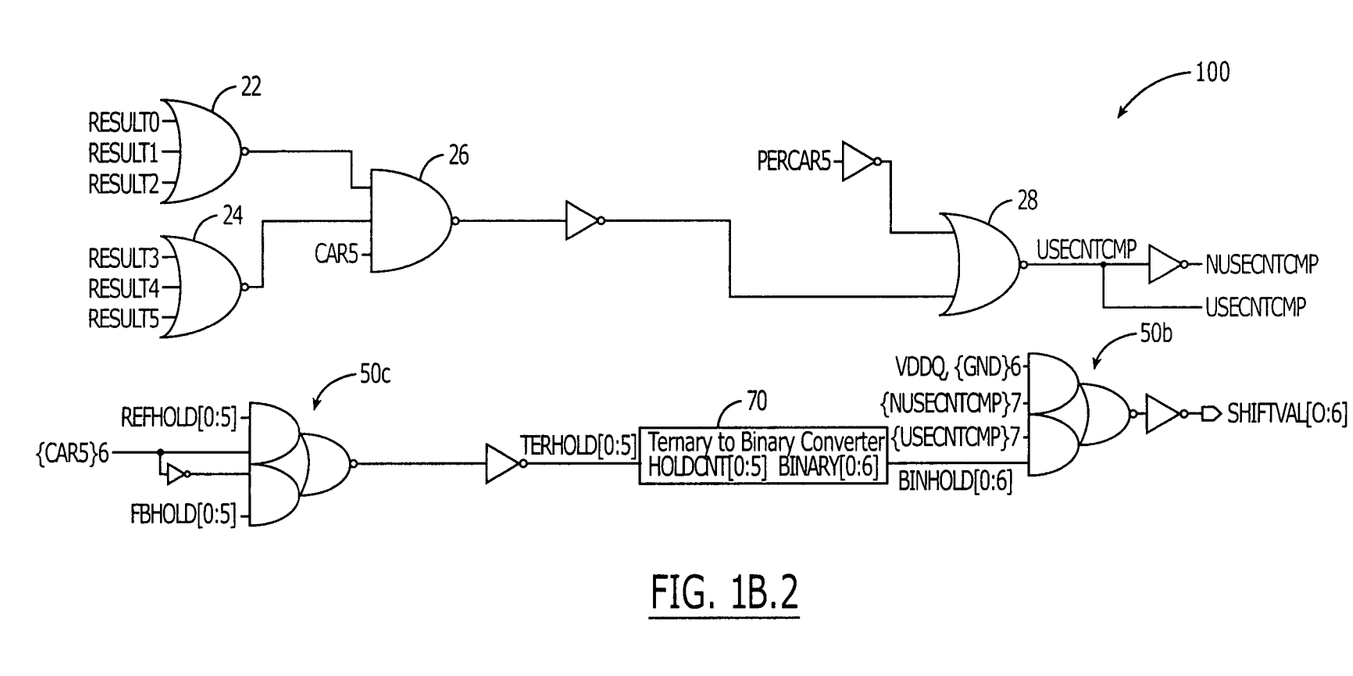

A first AND-OR logic circuit 50a generates the compare signal COMP in response to the compare output COMP of the first phase half-comparator 30a, the complementary signals NUSECNTCMP (not use count compare) and USECNTCMP (use count compare) and a carry signal CAR5. When USECNTCMP equals zero and NUSECNTCMP equals one, the compare output COMP reflects the value of COMPREFTOFB. As described more fully herein, this means the rising edge of FB is simply used to capture the current value of REF when performing the compare operation. The output of the first AND-OR logic circuit 50a switches from a count compare method to an edge compare method when the count compare operation may become ambiguous (i.e., when REFHOLD[0:5]=FBHOLD[0:5]). The signals NUSECNTCMP and USECNTCMP are generated by the logic illustrated by FIG. 1B.2. This logic, which includes the NOR gates 22, 24 and 28 and NAND gate 26, is responsive to a multi-bit result signal RESULT[0:5], a most significant bit of a multi-bit period carry signal PERCAR[0:5] and a most significant bit of a multi-bit carry signal CAR[0:5]. When PERCAR[5] equals zero, the signal USECNTCMP switches low and the signal NUSECNTCMP switches high. When this happens, the phase comparator 100 uses a conventional phase comparison method (i.e., an edge comparison method) to generate the compare signal COMP because the period of the reference clock signal REF is too small for the preferred counting phase comparison method to be effective. In addition, the shift value signal SHIFTVAL[0:6] is also set to 1000000, which is the smallest delay value the DLL integrated circuit 200 can shift the feedback clock signal FB in time by. However, when the signal USECNTCMP is set high, then the shift value signal SHIFTVAL[0:6] is equal to the shortest phase difference between the rising edges of FB and REF.

The carry signal CAR[0:5] and the result signal RESULT [0:5] are generated by a second ripple carry adder 60b and the period carry signal PERCAR[0:5] is generated by a first ripple carry adder 60a. These ripple carry adders 60a and 60b include first and second comparand inputs IN0 and IN1 and a carry input CIN and generate a carry output COUT and a sum output SUM. The first and second ripple carry adders 60a and 60b are 6-bit adders, which are also illustrated and described in the aforementioned '381 application. The second ripple carry adder 60b is configured to operate as a subtractor that uses count comparisons to determine the shortest route to phase lock. In particular, the second ripple carry adder 60b operates to compare REFHOLD[0:5] to FBHOLD[0:5] and uses the conventional phase comparison method when these signals are equal. If they are not equal, the smaller value of the two becomes the smallest phase difference between FB and REF, which is reflected in the value of TERHOLD[0:5]. For example, if REFHOLD[0:5] equals 010000 and FBHOLD[0:5] equals 100000, then CAR5 will equal zero and TERHOLD[0:5] will equal 100000. Here, the DLL integrated circuit 200 will subtract the binary derivative of TERHOLD[0:5], BINHOLD[0:6], from FB in order to bring FB into phase with REF. If the counting phase comparison method described herein is unable to make LOCK equal to one after one DLL clock cycle, then the phase comparator 100 will resort to the conventional phase comparison method (e.g., edge comparison method) and require one more DLL clock cycle to cause a lock condition (LOCK=1).

The lock signal LOCK is generated by logically ORing the pair of lock signals generated by the phase half-comparators 30a and 30b, which are shown as LOCKREFTOFB and LOCKFBTOREF. Operations to generate these lock signals will be described more fully hereinbelow with reference to FIGS. 3A–3C.

As illustrated by FIG. 1B.2, the shift value signal SHIFTVAL[0:6] is generated by a x7 AND-OR logic circuit 50b. Like the first AND-OR logic circuit 50a, the output of the x7 AND-OR logic circuit 50b switches from a count compare operation to an edge compare operation when the count compare operation may become ambiguous (i.e., when REFHOLD[0:5]=FBHOLD[0:5]). The 7-bit signal BINHOLD[0:6], which is provided to the AND-OR logic circuit 50b, is generated at the output of a ternary-to-binary converter 70, which is responsive to a 6-bit ternary hold signal TERHOLD[0:5]. This ternary-to-binary converter 70 takes bits that have absolute weights of $3 \times 2^n$ and converts them to bits that have absolute weights of $2^n$. The ternary hold signal TERHOLD[0:5] is generated by a x6 AND-OR logic circuit 50c, which is responsive to the 6-bit reference hold signal REFHOLD[0:5], the carry signal CAR5 and the feedback hold signal FBHOLD[0:5]. The reference hold signal REFHOLD[0:5] is generated by the first phase half-comparator 30a and the feedback hold signal FBHOLD[0:5] is generated by the second phase half-comparator 30b.

Referring now to FIG. 2, a phase half-comparator 30 is illustrated as including three NET DFFs 10c–10e, four PET DFFs 12b–12e, a pair of NOR gates 32 and 34 and a 6-bit counter 40b. The NET DFF 10c receives the FBDIV3 signal at its data input D and generates a feedback position signal FBPOS. The NET DFF 10d receives the FBDIV3 signal at its data input D and generates the reference position 0 signal REFPOS0 and the not reference position 0 signal NREF-POS0. The NET DFF 10e receives the REFPOS0 signal at its data input D and generates the reference position 1 signal REFPOS1 and the not reference position 1 signal NREF-POS1. The NOR gate 32 generates a reference time signal REFTIME in response to FBPOS, NREFPOS0 and REF-POS1.

When this reference time signal REFTIME is active at a high level, the 6-bit counter 40b is enabled to perform count operations. The PET DFF 12b receives the reference clock signal REF at its data input D and generates a reference beginning signal QREFBEG. The PET DFF 12c receives the FBDIV3 signal at its data input D and generates the reference position 2 signal REFPOS2 at its true output Q and the not reference position 2 signal NREFPOS2 at its complementary output NQ. The PET DFF 12d is synchronized with the signal NFB, which is an inverted version of the feedback clock signal FB. The PET DFF 12d receives the reference clock signal REF at its data input D and generates a reference midpoint signal QREFMID. An inverted version of this reference midpoint signal QREFMID operates as the compare signal COMP for the phase half-comparator 30. The PET DFF 12e receives the reference clock signal REF at its data input D and generates the not reference end signal NQREFEND at its complementary output NQ. The PET DFF 12e is synchronized with a delayed feedback clock signal FBD. The NOR gate 34 generates a lock signal LOCK for the phase half-comparator 30. This NOR gate 34 is responsive to the reference beginning signal QREFBEG and the not reference end signal NQREFEND. The 6-bit counter 40b generates the 6-bit reference hold signal REFHOLD[0:5] and the 6-bit not reference hold NREFHOLD signal NREFHOLD[0:5] for the phase half-comparator 30. The timing of the above-described signals FBDIV3, FB, REF, REFTIME, REFPOS[0:2] and FBPOS within the phase half-comparator 30 are also illustrated by FIG. 13 of the aforementioned '318 application.

Referring again to FIG. 1B, the phase comparator 100 is illustrated as being responsive to first and second periodic signals (REF and FB) which may have equivalent non-unity duty cycle ratios. The phase comparator 100 generates a compare signal COMP that identifies a direction the feedback clock signal FB should be shifted in time to bring it into alignment with the reference clock signal REF. This compare signal COMP is generated by comparing a first degree to which the reference clock signal REF leads the feedback clock signal FB to a second degree to which the reference clock signal REF lags the feedback clock signal FB. These comparison operations are performed by the logic associated with the first and second clock dividers 20a and 20b, the first and second phase half-comparators 30a and 30b, the first AND-OR logic circuit 50a, the first and second ripple carry adders 60a and 60b and the logic used to generate the complementary signals NUSECNTCMP and USECNTCMP. The phase comparator 100 determines a smaller of the first and second degrees and sets the compare signal COMP of FIG. 1A to a value that results in a speed-up of the feedback clock signal FB when the first degree is determined to be less than the second degree. Alternatively, the compare signal COMP is set at a value that results in a slow-down of the feedback clock signal FB when the second degree is determined to be less than the first degree. According to preferred aspects of the DLL integrated circuit 100, the delay line control circuit 120 may respond to the shift value signal SHIFTVAL[0:6] by adjusting the value of the control signal CNTL in a single cycle so that the phase of the feedback clock signal FB jumps by an amount sufficient to almost immediately place it into at least close alignment with the reference clock signal REF.

As illustrated by the NOR gate 16, the lock signal LOCK illustrated in FIG. 1B.1 is generated by logically ORing a first lock signal (LOCKREFTOFB), which specifies whether a leading edge of the reference clock signal REF is within a first time window (e.g., a 200 ps time window) relative to a leading edge of the feedback clock signal FB, and a second lock signal (LOCKFBTOREF), which specifies whether the leading edge of the feedback clock signal FB is within a second time window (e.g., 200 ps time window) relative to the leading edge of the reference clock signal REF.

Figure 3A:
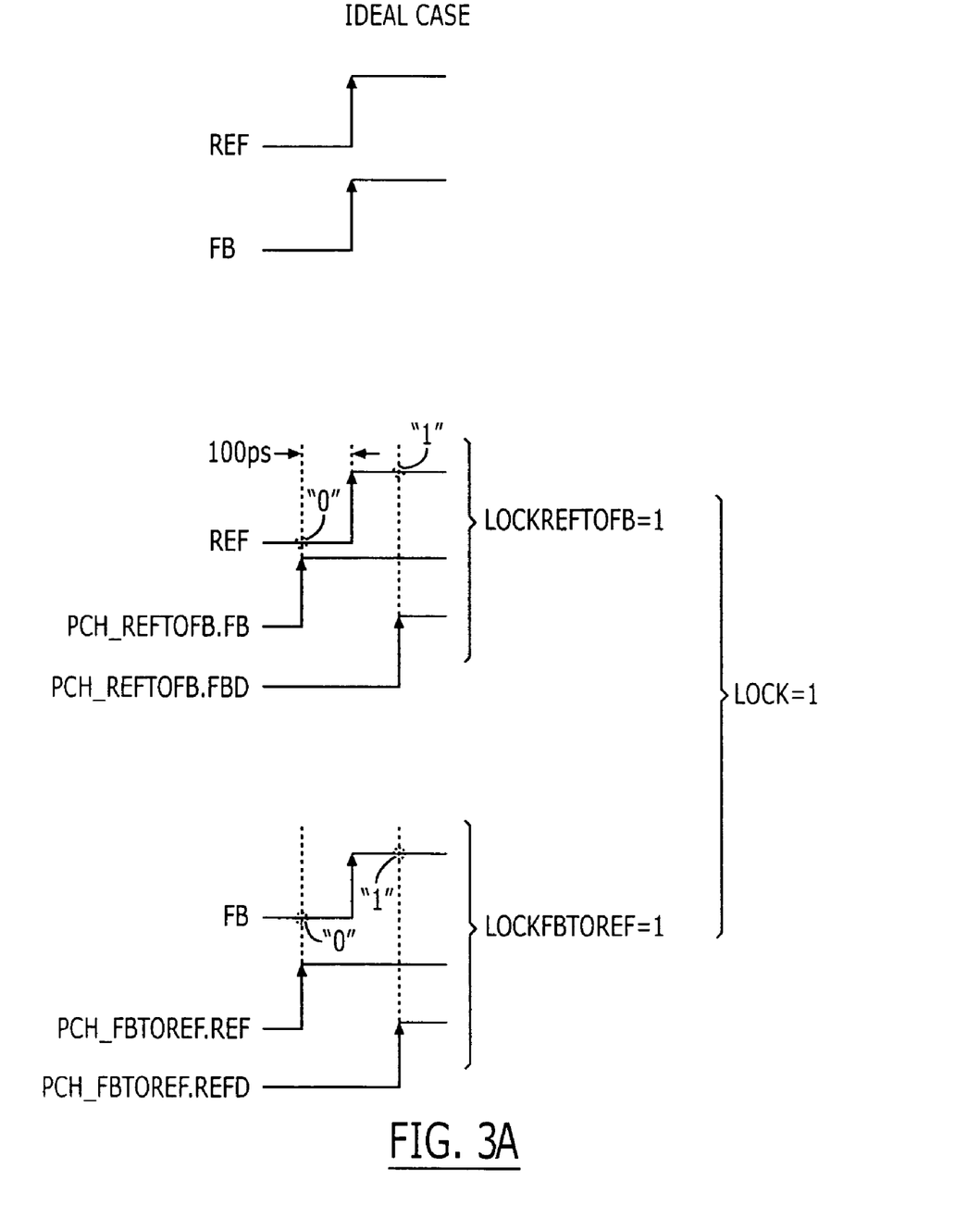
FIGS. 3A–3C are timing diagrams that illustrate various cases for generating the lock signal LOCK illustrated by FIG. 1B.
Figure 3B:
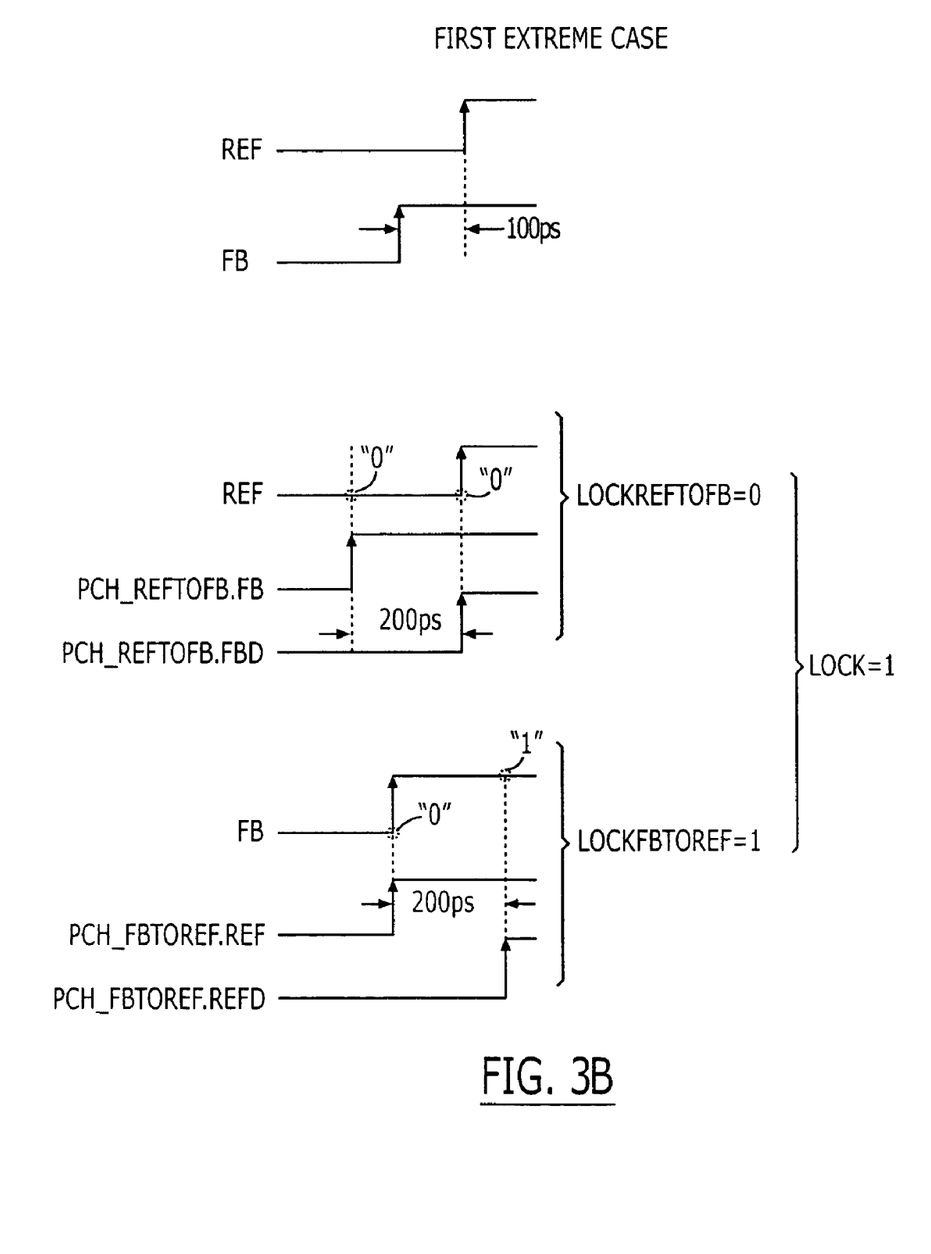
Figure 3C:
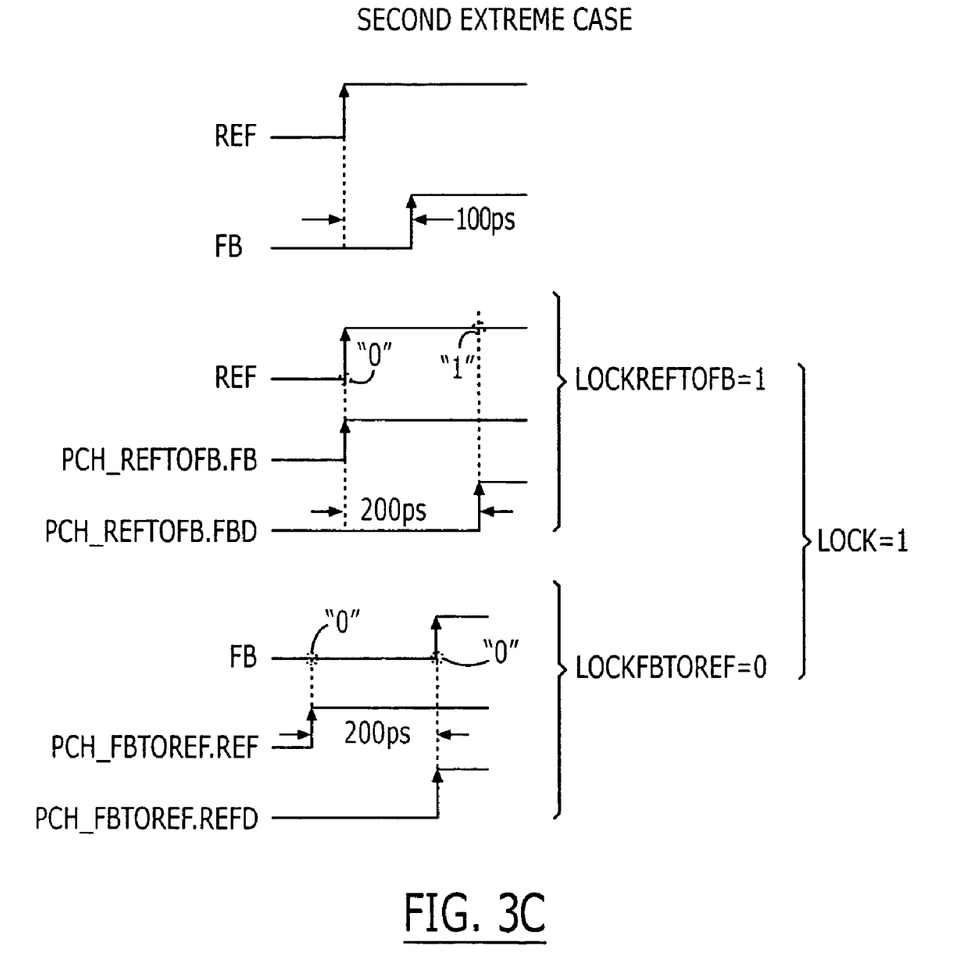

These operations to generate the first lock signal LOCK-REFTOFB at an output of the first phase half-comparator 30a and generate the second lock signal LOCKFBTOREF at an output of the second phase half-comparator 30b are illustrated by the timing diagrams of FIGS. 3A–3C. In particular, FIG. 3A illustrates an ideal case when the reference and feedback clock signals REF and FB are aligned with each other. Under this ideal timing condition, the first and second phase half-comparators 30a and 30b operate to identify whether or not the phases of the reference and feedback clock signals are sufficiently aligned to constitute a lock condition. In this example, a ±100 ps phase difference between the leading edges of the reference and feedback clock signals represents a lock condition. The determination of this lock condition occurs under two timing scenarios illustrated by FIG. 3A. Under the first timing scenario, accelerated and delayed versions of the feedback clock signal FB are used to capture the state of the reference clock signal REF as "0" and "1", respectively. These operations are performed within the first phase half-comparator 30a, with the reference clock signal REF being provided as a data input to the flip-flops 12b, 12d and 12e. If the nominal delay provided by an inverter equals 100 ps, then the delayed feedback clock signal FBD, which is provided to the clock input of PET DFF 12e, will be delayed by 200 ps relative to the clock input of PET DFF 12b, which receives the feedback clock signal FB. The clock signals provided to these two clock inputs are illustrated as PCH_REFTOFB.FB and PCH_REFTOFB.FBD in FIG. 3A, and the first lock signal LOCKREFTOFB is generated at the output of the NOR gate 34. Under the second timing scenario, accelerated and delayed versions of the reference clock signal REF are used to capture the state of the feedback clock signal FB as "0"

and "1", respectively. These operations are performed within the second phase half-comparator 30*b*, with the feedback clock signal FB being provided as a data input to the flip-flops 12*b*, 12*d* and 12*e*. The clock signals provided to the clock inputs of flip-flop 12*b* and 12*e* are illustrated as PCH_FBTOREF.REF and PCH_FBTOREF.REFD, respectively, in FIG. 3A. The second lock signal LOCKFBTOREF is generated at the output of the NOR gate 34. Accordingly, under this ideal timing condition, both the first and second lock signals LOCKREFTOFB and LOCKFBTOREF will be generated at logic 1 values and passed to an output of the phase comparator 100 as a LOCK signal having an active high level.

FIG. 3B illustrates a first extreme case when the feedback clock signal FB leads the reference clock signal REF by 100 ps. Under this extreme case, the first and second phase half-comparators 30*a* and 30*b* operate to identify whether or not the phases of the reference and feedback clock signals are sufficiently aligned to constitute a lock condition. The determination of this lock condition occurs under two timing scenarios illustrated by FIG. 3B. Under the first timing scenario, accelerated and delayed versions of the feedback clock signal FB are used to capture the state of the reference clock signal REF as "0" and "0", respectively. These operations are performed within the first phase half-comparator 30*a*, with the reference clock signal REF being provided as a data input to the flip-flops 12*b*, 12*d* and 12*e*. The clock signals provided to the clock inputs of flip-flops 12*b* and 12*e* are illustrated as PCH_REFTOFB.FB and PCH_REFTOFB.FBD, respectively, and the first lock signal LOCKREFTOFB is generated as a logic 0 signal, which indicates a failure to detect a lock condition. Under the second timing scenario, accelerated and delayed versions of the reference clock signal REF are used to capture the state of the feedback clock signal FB as "0" and "1", respectively. These operations are performed within the second phase half-comparator 30*b*, with the feedback clock signal FB being provided as a data input to the flip-flops 12*b*, 12*d* and 12*e*. The clock signals provided to the clock inputs of flip-flop 12*b* and 12*e* are illustrated as PCH_FBTOREF.REF and PCH_FBTOREF.REFD, respectively, in FIG. 3B. The second lock signal LOCKFBTOREF is generated as a logic 1 signal to indicate a lock condition. Accordingly, under this first extreme case, the second lock signal LOCKFBTOREF will be generated at a logic 1 value and passed to an output of the phase comparator 100 as a LOCK signal having an active high level.

FIG. 3C illustrates a second extreme case when the feedback clock signal FB lags the reference clock signal REF by 100 ps. Under this extreme case, the first and second phase half-comparators 30*a* and 30*b* operate to identify whether or not the phases of the reference and feedback clock signals are sufficiently aligned to constitute a lock condition. The determination of this lock condition occurs under two timing scenarios illustrated by FIG. 3C. Under the first timing scenario, accelerated and delayed versions of the feedback clock signal FB are used to capture the state of the reference clock signal REF as "0" and "1", respectively. These operations are performed within the first phase half-comparator 30*a*, with the reference clock signal REF being provided as a data input to the flip-flops 12*b*, 12*d* and 12*e*. The clock signals provided to the clock inputs of flip-flops 12*b* and 12*e* are illustrated as PCH_REFTOFB.FB and PCH_REFTOFB.FBD, respectively, and the first lock signal LOCKREFTOFB is generated as a logic 1 signal, which indicates a lock condition. Under the second timing scenario, accelerated and delayed versions of the reference clock signal REF are used to capture the state of the feedback clock signal FB as "0" and "0", respectively. These operations are performed within the second phase half-comparator 30*b*, with the feedback clock signal FB being provided as a data input to the flip-flops 12*b*, 12*d* and 12*e*. The clock signals provided to the clock inputs of flip-flop 12*b* and 12*e* are illustrated as PCH_FBTOREF.REF and PCH_FBTOREF.REFD, respectively, in FIG. 3C. The second lock signal LOCKFBTOREF is generated as a logic 0 signal, which indicates a failure to detect a lock condition. Accordingly, under this second extreme case, the first lock signal LOCKREFTOFB will be generated at a logic 1 value and passed to an output of the phase comparator 100 as a LOCK signal having an active high level.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A locked loop integrated circuit, comprising:
a phase comparator having first and second input terminals configured to receive first and second periodic signals having substantially equivalent periods, said phase comparator configured to generate a signal at an output terminal that identifies a direction the second periodic signal should be shifted in time to bring it into alignment with the first periodic signal by comparing a first degree to which the first periodic signal leads the second periodic signal to a second degree to which the first periodic signal lags the second periodic signal.

2. The circuit of claim 1, wherein said phase comparator is further configured to determine a smaller of the first and second degrees; and wherein the direction equals a speed-up direction when the first degree is determined to be less than the second degree; and wherein the direction equals a slow-down direction when the second degree is determined to be less than the first degree.

3. The circuit of claim 2, wherein said phase comparator is further configured to generate a shift value signal that specifies an amount the second periodic signal needs to be shifted to bring it into alignment with the first periodic signal.

4. A locked loop integrated circuit, comprising:
a phase comparator having first and second input terminals configured to receive first and second periodic signals having substantially equivalent periods, said phase comparator configured to generate a signal at an output terminal that identifies a direction the second periodic signal should be shifted in time to bring it into alignment with the first periodic signal by comparing a first degree to which the first periodic signal leads the second periodic signal to a second degree to which the first periodic signal lags the second periodic signal; and
wherein said phase comparator is further configured to generate a shift value signal that specifies an amount the second periodic signal needs to be shifted to bring it into alignment with the first periodic signal.

5. The circuit of claim 4, wherein the shift value signal is a multi-bit digital signal.

6. The circuit of claim 4, wherein said phase comparator is further configured to generate a period value signal that specifies a period of the first periodic signal.

7. The circuit of claim 6, wherein the shift value signal and the period value signal are multi-bit digital signals.

8. The circuit of claim 4, wherein said phase comparator is further configured to generate a lock signal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

9. The circuit of claim 8, wherein a width of the first time window equals a width of the second time window.

10. The circuit of claim 6, wherein said phase comparator is further configured to generate a lock signal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

11. The circuit of claim 10, wherein a width of the first time window equals a width of the second time window.

12. A locked loop integrated circuit, comprising:
a phase comparator having first and second input terminals configured to receive first and second periodic signals having substantially equivalent periods, said phase comparator configured to generate a signal at an output terminal that identifies a direction the second periodic signal should be shifted in time to bring it into alignment with the first periodic signal by comparing a first degree to which the first periodic signal leads the second periodic signal to a second degree to which the first periodic signal lags the second periodic signal; and
wherein said phase comparator is further configured to generate a period value signal that specifies a period of the first periodic signal.

13. A locked loop integrated circuit, comprising:
a phase comparator having first and second input terminals configured to receive first and second periodic signals having substantially equivalent periods, said phase comparator configured to generate a signal at an output terminal that identifies a direction the second periodic signal should be shifted in time to bring it into alignment with the first periodic signal by comparing a first degree to which the first periodic signal leads the second periodic signal to a second degree to which the first periodic signal lags the second periodic signal; and
wherein said phase comparator is further configured to generate a lock signal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

14. The circuit of claim 13, wherein a width of the first time window equals a width of the second time window.

15. A delay-locked loop integrated circuit, comprising:
a phase comparator having first and second input terminals configured to receive reference and feedback clock signals having equivalent periods and equivalent non-unity duty cycle ratios, said phase comparator configured to determine whether a first degree to which the reference clock signal leads the feedback clock signal is smaller or larger than a second degree to which the reference clock signal lags the feedback clock signal and further configured to generate a compare signal at an output terminal that identifies a direction in time the feedback clock signal should be shifted to bring it into alignment with the reference clock signal.

16. The circuit of claim 15, wherein the direction equals a speed-up direction when the first degree is determined to be less than the second degree; and wherein the direction equals a slow-down direction when the second degree is determined to be less than the first degree.

17. The circuit of claim 15, wherein said phase comparator is further configured to generate a shift value signal that specifies an amount the feedback clock signal needs to be shifted to bring it into alignment with the reference clock signal.

18. The circuit of claim 17, wherein said phase comparator is further configured to generate a period value signal that specifies a period of the reference clock signal.

19. The circuit of claim 15, wherein said phase comparator is further configured to generate a period value signal that specifies a period of the reference clock signal.

20. The circuit of claim 15, wherein said phase comparator is further configured to generate a lock signal that identifies whether or not the reference and feedback clock signals are aligned with each other by logically ORing a first lock signal, which specifies whether a leading edge of the reference clock signal is within a first time window relative to a leading edge of the feedback clock signal, and a second lock signal, which specifies whether the leading edge of the feedback clock signal is within a second time window relative to the leading edge of the reference clock signal.

21. The circuit of claim 15, wherein said phase comparator comprises:
a first clock generator that is configured to generate a divide-by-N feedback clock signal in response to the feedback clock signal, where N is an integer greater than two;
a second clock generator that is configured to generate a divide-by-N reference clock signal in response to the reference clock signal;
a first phase half-comparator that is configured to generate a first lock signal in response to the reference clock signal, the feedback clock signal and the divide-by-N feedback clock signal; and
a second phase half-comparator that is configured to generate a second lock signal in response to the reference clock signal, the feedback clock signal and the divide-by-N reference clock signal.

22. The circuit of claim 21, wherein said phase comparator further comprises logic that is configured to logically OR the first and second lock signals.

23. A locked loop integrated circuit, comprising:
a phase comparator having first and second input terminals configured to receive first and second periodic signals having substantially equivalent periods, said phase comparator configured to compare a first degree to which the first periodic signal leads the second periodic signal to a second degree to which the first periodic signal lags the second periodic signal; and
wherein said phase comparator is further configured to generate a shift value signal at an output terminal that specifies an amount the second periodic signal needs to be shifted to bring it into alignment with the first periodic signal.

24. The circuit of claim 23, wherein the shift value signal is a multi-bit digital signal.

25. The circuit of claim 23, wherein said phase comparator is further configured to generate a period value signal that specifies a period of the first periodic signal.

26. The circuit of claim 25, wherein the shift value signal and the period value signal are multi-bit digital signals.

27. The circuit of claim 23, wherein said phase comparator is further configured to generate a lock signal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

28. The circuit of claim 27, wherein a width of the first time window equals a width of the second time window.

29. The circuit of claim 25, wherein said phase comparator is further configured to generate a lock signal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

30. The circuit of claim 29, wherein a width of the first time window equals a width of the second time window.

31. A locked loop integrated circuit, comprising:
a phase comparator having first and second input terminals configured to receive first and second periodic signals having substantially equivalent periods, said phase comparator configured to compare a first degree to which the first periodic signal leads the second periodic signal to a second degree to which the first periodic signal lags the second periodic signal; and
wherein said phase comparator is further configured to generate a period value signal at an output terminal that specifies a period of the first periodic signal.

32. A locked loop integrated circuit, comprising:
a phase comparator having first and second input terminals configured to receive first and second periodic signals having substantially equivalent periods, said phase comparator configured to compare a first degree to which the first periodic signal leads the second periodic signal to a second degree to which the first periodic signal lags the second periodic signal; and
wherein said phase comparator is further configured to generate a lock signal at an output terminal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

33. The circuit of claim 32, wherein a width of the first time window equals a width of the second time window.

34. A locked loop integrated circuit, comprising:
a phase comparator having first and second input terminals configured to receive first and second periodic signals having substantially equivalent periods, said phase comparator configured to generate a shift value signal at an output terminal that specifies an amount the second periodic signal needs to be shifted to bring it into alignment with the first periodic signal and further configured to periodically update a value of the shift value signal at a frequency that is a fraction of a frequency of the second periodic signal.

35. A locked loop integrated circuit, comprising:
a phase comparator having first and second input terminals configured to receive first and second periodic signals having substantially equivalent periods, said phase comparator configured to generate a shift value signal at an output terminal that specifies an amount the second periodic signal needs to be shifted to bring it into alignment with the first periodic signal and further configured to generate first and second divide-by-3 versions of the first and second periodic signals, respectively, to support generation of the shift value signal.

36. A locked loop integrated circuit, comprising:
a phase comparator having first and second input terminals configured to receive first and second periodic signals having substantially equivalent periods, said phase comparator configured to generate a lock signal at an output terminal that identifies whether or not the first and second periodic signals are aligned with each other by logically ORing a first lock signal, which specifies whether a leading edge of the first periodic signal is within a first time window relative to a leading edge of the second periodic signal, and a second lock signal, which specifies whether the leading edge of the second periodic signal is within a second time window relative to the leading edge of the first periodic signal.

* * * * *